United States Patent [19]

Seytre et al.

[11] 4,314,311

[45] Feb. 2, 1982

[54] PLUG-IN CARD SUPPORT PROVIDING ELECTRIC AND THERMAL CONNECTIONS

[75] Inventors: Bruno Seytre; Hervé Bricaud, both of Suresnes, France

[73] Assignee: Socapex, Suresnes, France

[21] Appl. No.: 138,319

[22] Filed: Apr. 8, 1980

[30] Foreign Application Priority Data

Oct. 26, 1979 [FR] France ............................... 79 26613

[51] Int. Cl.³ ............................................ H05K 7/20

[52] U.S. Cl. .................................. 361/386; 361/387; 339/112 R

[58] Field of Search ............................... 361/381-383, 361/386-388, 413, 415; 174/16 HS; 339/17 R, 17 L, 17 LC, 112 R, 176 MP

[56] References Cited

U.S. PATENT DOCUMENTS

| | | | |
|---|---|---|---|
| 3,506,878 | 4/1970 | Gray | 361/387 |
| 3,631,325 | 12/1971 | Wenz | 361/387 |
| 4,063,791 | 12/1977 | Cutchaw . | |
| 4,082,407 | 4/1978 | Smorzaniuk | 361/413 |
| 4,142,226 | 2/1979 | Mears | 361/413 |

FOREIGN PATENT DOCUMENTS 1965851 7/1970 Fed. Rep. of Germany .

OTHER PUBLICATIONS

IBM Technical Disclosure Bulletin, vol. 20, No. 9, Feb. 1978.
K. P. Moran et al., "Spring-loaded Module Connectors for Mounting an Array of Modules on Circuit Board", pp. 3434-3435.
IBM Technical Disclosure Bulletin, vol. 18, No. 3, Aug. 1975.
R. H. A. Watson, "Full Semiconductor Wafer Package", p. 642.
IBM Technical Disclosure Bulletin, vol. 20, No. 11A, Apr. 1978.
P. W. Hardin, "Integral edge connector", pp. 4346-4348.

*Primary Examiner*—Gerald P. Tolin
*Attorney, Agent, or Firm*—Cushman, Darby & Cushman

[57] ABSTRACT

A card-edge connector support providing electric and thermal connections for cards or boards of the printed circuit type in which removal of thermal energy constitutes an essential requirement. The support comprises a common flat base adapted to carry a plurality of strip connectors placed at right angles to each other, a groove being formed in each strip for receiving one edge of the card. The opposite internal faces of the groove are adapted to carry electrical and thermal contacts respectively, the bearing force for heat transmission being obtained by elastic deformation of the electrical contacts.

3 Claims, 3 Drawing Figures

PLUG-IN CARD SUPPORT PROVIDING ELECTRIC AND THERMAL CONNECTIONS

BACKGROUND OF THE INVENTION

This invention relates to the field of card-edge connectors for plug-in board circuits.

A plug-in board (designated hereinafter as a card) has the appearance of a small plate having the shape of a quadrilateral and formed of electrically insulating material. The card is designed to support a plurality of electronic components and interconnecting leads, such leads being formed in the majority of instances by depositing a metal having good electrical conductivity on the card.

Connection with external utilization circuits is effected by means of a plurality of contacts placed on one or a number of sides of the card and adapted to cooperate with contacts of complementary shape forming part of a fixed connector which is connected to the utilization circuits. As a general rule, said connector performs a second function, namely that of serving as a mechanical support for the card in the equipment in which it is employed.

By virtue of the fact that the plug-in card has the shape of a quadrilateral, the connectors are thus endowed with the general structure of elongated blocks in the form of strips placed at right angles on a common flat base.

In one form of construction which is frequently encountered, and in particular when provision is made for four strips connectors defining a closed quadrilateral, positioning of a plug-in card for connection and fixing calls for the construction of strip connectors in two portions which are capable of relative displacement with respect to each other. This entails the need to initiate an operation in two stages: a card insertion stage corresponding to an open position of the movable portion followed by a card connecting and fixing stage corresponding to the closed position of said movable portion.

In some cases, these arrangements provide the possibility of placing a card in position by means of a single movement of translation in a direction parallel to a strip connector, in the open position which effects a withdrawal of the electric contacts and ensures frictionless insertion of the card.

However, in an increasing number of applications encountered in practice, plug-in circuits of this type utilize electric power values which are constantly becoming higher and this gives rise to the problem of dissipation of the thermal energy released by Joule effect.

In one known solution, to this problem cooling units positioned in the central region of the card, the cooling units being constituted by a block of material having good thermal conductivity and provided with fins for increasing its surface area, heat removal being performed by convection in the surrounding air.

However, a design of this type has limited heat-removal possibilities as a result of the inevitably small surface area available for the cooling unit. Furthermore, the permissible weight of this unit is also small by reason of the service requirements of high resistance of the card thus equipped both to impacts and vibrations. Finally, fixing of the cooling unit on the substrate board presents a problem which is difficult to solve by reason of the differences in thermal expansion between these two elements respectively fabricated for example from an alloy of aluminum and alumina and having very different coefficients of expansion. The methods often adopted for bonding by means of a silicone joint offer a degree of resistance which is not only of a low order but is also temporary.

Another type of solution has been proposed for utilizing the support strips themselves. Some regions of these strips are interposed between the electric-contact regions and are accordingly fitted with elements so arranged that certain surfaces of these elements are placed in thermal contact with the edges of the card to be cooled.

However, the assignment of a third function or heat-removal function to the supporting strip-connector comes up against difficulties in known forms of construction since electric and thermal connections cannot readily be obtained at the same time. The technical requirements to be satisfied for these two types of connection are in fact different and the juxtaposition of regions assigned alternately to the two functions along a single strip suffers from a certain degree of incompatibility by reason of the different contact surfaces and bearing pressures to be employed.

SUMMARY OF THE INVENTION

The object of the present invention is therefore to provide a support for a plug-in board or card which ensures simultaneous performance of both functions of electric and thermal connection but is not subject to the disadvantages normally attendant this type of solution.

In its basic principle, the invention involves longitudinal division of each support strip into two portions, one face of each portion being placed respectively in opposite relation to one of the two faces of the plug-in card provided respectively with an electric-contact face and a thermal-contact face. The invention is distinguished by the fact that the bearing pressure which is necessary in order to apply the card firmly against the thermal-contact face is produced by the elasticity of the contacts which are present on the electric-contact face of the strip.

In more exact terms, the invention consists of a plug-in card support providing electric and thermal contacts, comprising a common flat base adapted to carry a plurality of strip connectors placed at right angles to each other, each strip being provided with a groove for receiving one edge of the card. The invention is distinguished by the fact that the two opposite internal faces of each groove are adapted to carry electric and thermal contact elements respectively; the bearing force exerted between the card and the thermal contacts is produced by the bearing force between said card and the electrical contacts which are endowed with elasticity.

BRIEF DESCRIPTION OF THE DRAWINGS

Other features of the invention will be more apparent on consideration of the following description and accompanying drawings, wherein.

DETAILED DESCRIPTION OF THE PREFERRED EMBODIMENTS

Figure 1:
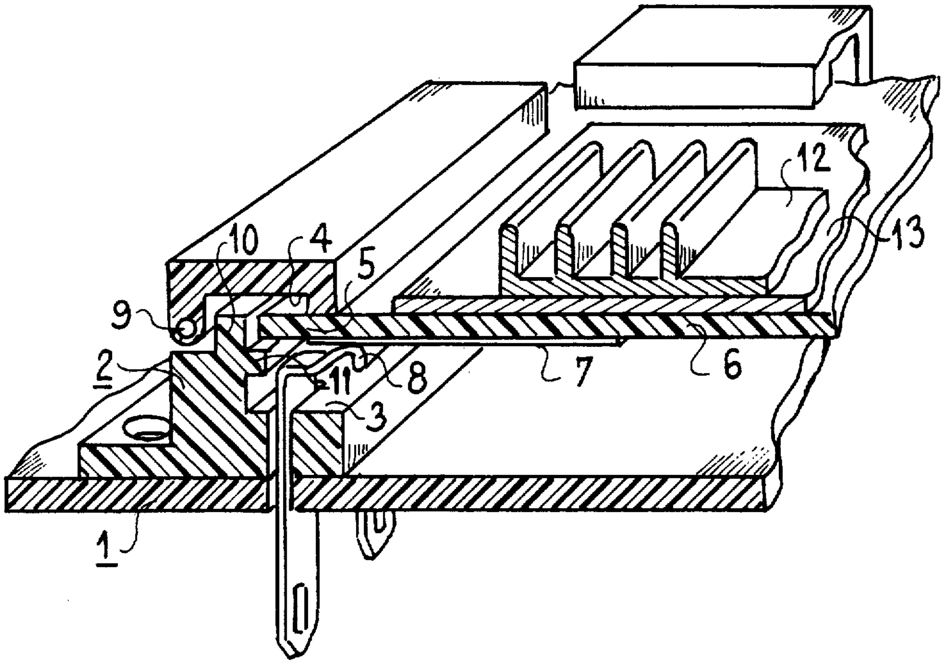
FIG. 1 illustrates an electrical connection support for a board circuit of known type.

FIG. 1 shows an electrical connection support for a board circuit of known type.

The support comprises a base 1 on which are fixed strip connectors of the type designated by the reference numeral 2. A groove having two opposite faces 3 and 4 is formed in each strip and adapted to receive one edge 5 of a board circuit or card 6. One of the faces 3 of the groove is intended to provide an electric connection with the electric circuit 7 carried by the card 6 and is adapted to carry contact elements such as the element 8 which are endowed with elasticity both by virtue of their constituent material and their shape.

In order to insert a card within the support, the second face 4 of the groove carried by the strip connector 2 is movable and capable of pivotal displacement about the point 9. In the open position, it is an easy matter to introduce the card, the position of which is defined by the abutment shoulders 10 and 11. The closed position shown in the figure has the effect of applying the card against the abutment shoulder 11 while at the same time compressing the contact 8 which bends back under the action of elasticity and effects the electric connection with the necessary bearing force.

Depending on whether the strip connectors occupy either three or four sides of the quadrilateral, insertion of the card can take place either in a sliding movement parallel to the grooves or in a translational movement at right angles to these latter.

The electric-connection support of FIG. 1 is not provided with any means for removing the thermal energy released by the board circuit and this latter must accordingly be fitted with separate means consisting of a finned cooling unit 12 which operates by convection in the surrounding air.

This arrangement offers only a limited solution to this problem by reason of the essential requirements of reduction in both size and weight of the cooling unit 12, even when the card 6 is fitted with a heat conduction plate such as the plate 13 which is formed of metal having good conductivity. Furthermore, it is impossible to employ double-face circuits in conjunction with a circuit of the type comprising an integrated cooling unit. Finally, as already mentioned in the foregoing, fixing of the cooling unit on the card is not only awkward in practice but offers low reliability over a long period of service.

Figure 2:
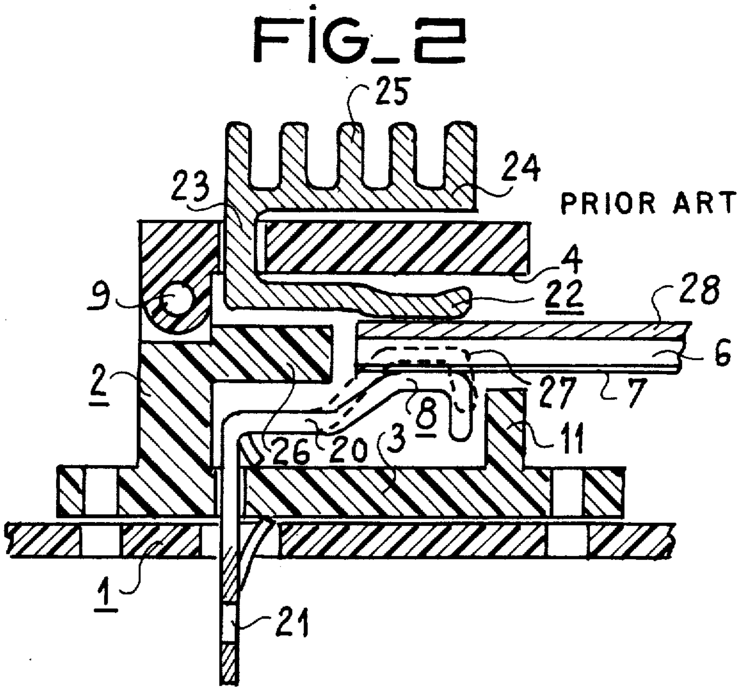
FIG. 2 illustrates one embodiment of the electric and thermal connection circuit according to the invention with convection cooling.

FIG. 2 shows in cross-section one embodiment of the electric and thermal connection support according to the invention in which cooling takes place by convection. In this figure, the same elements as those of FIG. 1 are designated by the same references and only one strip connector per channel is shown for the sake of enhanced simplicity, the remainder of the support being similar to that shown in FIG. 1.

The strip comprises a block 2 provided with a longitudinal groove having the cross-sectional shape of a horseshoe with two opposite arms corresponding to the two faces 3 and 4 and assigned respectively to electric and thermal connection with the card 6. The electrical face of the strip is adapted to carry contacts such as the contact 8, with a portion 20 which ensures the possibility of elastic deformation of the contact. A connecting lug 21 provides a connection with external circuits. The thermal face 4 of the strip is adapted to carry thermal contacts such as 22 which are made of material having good heat conductivity and transfer the thermal energy to be removed by virtue of a cross-section of suitable area via a transmission member such as 23 associated with a cooling unit 24 which is provided with fins 25 and operates by convection in the surrounding air.

A strip connector of this type operates as follows: the two faces 3 and 4 of the strip connector 2 are capable of displacement with respect to each other by rotation about the axis 9. In the card positioning stage, the connector is open, the face 4 forms an angle which frees the face 3, and the card 6 is inserted and positioned transversely by means of the abutment shoulder 26.

The electrical contact takes up the position 27 shown in dashed lines. The card is constituted by two superposed layers consisting of an electrically insulating substrate 6 which carries the electric circuit 7 and its connection regions, and a layer 28 of material having good thermal conduction such as a metal for example, this layer being often designated as a heatsink. In the connecting stage, the connector closes as shown in the figure and the thermal contact 22 is applied against the surface of the heatsink. At the same time, the electrical contact 8 is forced back and assumes the shape shown in full lines in the figure, under the action of elasticity.

A main feature of the invention lies in the fact that, as a result of a suitable choice of shape, dimensions and material of the electrical contact, the bearing force necessary for good thermal conduction between the heatsink 28 and the contact 22 is obtained precisely by virtue of the resilient force produced by the oppositely-facing electrical contact.

A second abutment shoulder 11 which is parallel to the direction of insertion of the card determines the amplitude of the movement of insertion in order to prevent overstepping of the limit of elasticity as a result of excessive compression of the contact.

Moreover, the possibilities of thermal dissipation are better in the case of the invention since the area of the contact band of the edges of a card is larger than the area of the central region which is the only region to be cooled in the known art as shown in FIG. 1.

Figure 3:
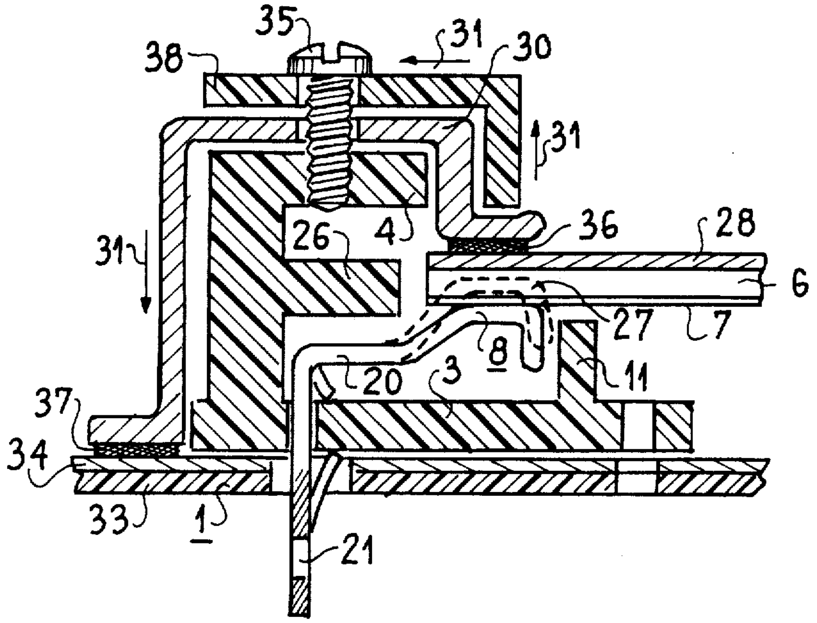
FIG. 3 illustrates another embodiment of the support according to the invention with conduction cooling.

FIG. 3 illustrates another embodiment of the support according to the invention in which cooling takes place by conduction.

In this embodiment which is particularly well suited to cards generating large quantities of heat, conduction in a base having large dimensions is substituted for the process of convection in air.

For the card-inserting operation, the pivotal strip connector of FIG. 2 is accordingly adapted to this different embodiment as shown in FIG. 3 by replacing the pivotal movement of the thermal face by a translational movement at right angles to the plane of the card.

In this case also, the thermal contact with said card and the bearing force of this latter result from the resilient force of the electrical contact 8.

The external portion 30 of the cooling unit is no longer provided with fins and assumes the sole function of heat conduction in the direction of the arrows such as the arrow 31 and towards the base 1 which comprises an insulating layer 33 and a base heatsink 34 of material having good thermal conductivity.

After insertion of the card and of the thermal face of the strip connector, fixing means such as screws 35 ensure that the two desired types of contact are obtained in a satisfactory manner.

Although the connector according to the invention produces satisfactory results as described in the foregoing, it may be an advantage to improve the heat transmission at the incoming and outgoing contact points of the thermal conductor by interposing at 36 and 37 a product in a fluid state, in the form of a paste, or in a plastic state, and having a base of silicones, for example. This would dispense with the need for unduly accurate surface machining between the corresponding contact zones.

The interposition of heat-transmission material which has just been mentioned is also advantageous in the embodiment of FIG. 2.

It should be pointed out by way of conclusion that, although the foregoing description has been given in the case of a card having a heatsink, experiments and measurements performed by the present Applicant have shown that the requisite cooling action is obtained under satisfactory conditions with cards having a single substrate of ceramic material, thus broadening the field of application of the electric and thermal connector support according to the invention.

What is claimed is:

1. A plug-in card support providing electrical and thermal connections, comprising:

a common flat base comprising an insulating layer and a base heat sink, forming a heat conduction cooling unit, a strip connector on said base and having groove means therein for receiving one edge of a circuit card having on one side an electric circuit and on the other side a heat-sink, the two opposite internal faces of said groove means carrying respectively an electrical contact having elasticity and a thermal contact, the various elements being positioned and sized so as to create a bearing force between an inserted circuit card heat sink and the thermal contact produced by a bearing force between said card circuit and the strip connector electrical contact, a thermal conductor coupling element coupling the thermal contact with said heat conduction cooling unit, the coupling element being supported by the strip connector, and fixing means on said support for providing secure thermal and electrical contact.

2. A plug-in card support according to claim 1, wherein a heat-conducting plastic paste is placed in position at both ends of the thermal conductor coupling element.

3. A plug-in card support according to claim 1 or claim 2, wherein there are three additional connector strips disposed on the common flat base so as to form a rectangular quadrilateral.

* * * * *